(12) United States Patent
Siohan et al.

(10) Patent No.: US 6,812,873 B1
(45) Date of Patent: Nov. 2, 2004

(54) METHOD FOR DECODING DATA CODED WITH AN ENTROPIC CODE, CORRESPONDING DECODING DEVICE AND TRANSMISSION SYSTEM

(75) Inventors: Pierre Siohan, Rennes (FR); Lionel Guivarch, Cesson Sevigne (FR); Jean-Claude Carlac'h, Rennes (FR)

(73) Assignee: France Telecom, Paris Cedex (FR)

( * ) Notice: Subject to any disclaimer, the term of this patent is extended or adjusted under 35 U.S.C. 154(b) by 36 days.

(21) Appl. No.: 10/111,833

(22) PCT Filed: Nov. 2, 2000

(86) PCT No.: PCT/FR00/03061

§ 371 (c)(1),
(2), (4) Date: Jul. 23, 2002

(87) PCT Pub. No.: WO01/35535

PCT Pub. Date: May 17, 2001

(30) Foreign Application Priority Data

| Nov. 9, 1999 | (FR) | 99 14321 |
| Apr. 13, 2000 | (FR) | 00 04787 |

(51) Int. Cl.[7] .................................................. H03M 7/00

(52) U.S. Cl. ........................................ 341/107; 341/51

(58) Field of Search .......................... 341/107, 51, 50, 341/67; 375/95

(56) References Cited

U.S. PATENT DOCUMENTS 4,267,595 A * 5/1981 Hernandez .................... 375/95
6,215,422 B1 * 4/2001 Henry et al. .................. 341/51

OTHER PUBLICATIONS

"Joint Source–Channel Soft Decoding of Huffman Codes with Turbo–Codes" by L. Guivarch et al., *Information Theory Workshop ITW98*, XP–002143090 pp. 83–92, Mar. 2000.

"Iterative Source/Channel–Decoding Using Reversible Variable Length Codes" by R. Bauer et al., for *Data Compression Conference* XP002154238, pp. 93–102, Mar. 2000.

"Joint Source–Channel Decoding of Variable–Length Encoded Sources" by A. Murad et al., XP002143123, *Information Theory Workshop ITW98*, pp. 94–95, Jun. 1998.

"Joint Source–Channel Decoding of Entropy Coded Markov Sources over Binary Symmetric Channels" by K.P. Subbalakshmi et al., *International Conference on Communications* vol. 1, pp. 446–450, Jun. 1999.

"Improved Joint Source–Channel Decoding for Variable–Length Encoded Data Using Soft Decisions and MMSE Estimation" by M. Park et al., *Proceedings of Conference on Data Compression (DCC'99)*, XP002143145, pp. 554, Mar. 1999.

"Utilizing Soft Information in Decoding of Variable Length Codes" by J. Wen et al., *Proceedings of Conference on Data Compression (DCC'99)*, XP002143233, pp. 131–139, Mar. 1999.

* cited by examiner

*Primary Examiner*—Brian Young
*Assistant Examiner*—Joseph Lauture
(74) *Attorney, Agent, or Firm*—Westman, Champlin & Kelly, P.A.

(57) ABSTRACT

The invention concerns a method for decoding received digital data corresponding to transmitted digital data coded with an entropic code associating with each word of an alphabet a distinct bit sequence, whereof the length is a function of said word occurrence probability, using a decoding lattice whereof each transition corresponds to a binary value 0 or 1 of one of the bits of a sequence corresponding to one of said words.

31 Claims, 4 Drawing Sheets

METHOD FOR DECODING DATA CODED WITH AN ENTROPIC CODE, CORRESPONDING DECODING DEVICE AND TRANSMISSION SYSTEM

CROSS-REFERENCE TO RELATED APPLICATION

This Application is a Section 371 National Stage Application of International Application No. PCT/FR00/03061 filed Nov. 2, 2000 and published as WO 01/35535 on May 17, 2001, not in English.

FIELD OF THE INVENTION

The field of the invention is that of the transmission or broadcasting of digital data signals. More specifically, the invention relates to the decoding of transmitted digital signals and, especially, source decoding. More specifically again, the invention can be applied to the decoding of data encoded with a source encoding method using entropic codes such as the VLC or variable length code.

BACKGROUND OF THE INVENTION

The digital communications systems commonly used today rely on encoding systems that implement, on the one hand, source encoding and, on the other, channel encoding. Conventionally, these two encoding systems are optimized separately. The purpose of the source encoding is to achieve maximum reduction in the redundancy of the source signal to be transmitted. Then, to protect this information from the disturbance inherent in all transmission, the channel encoder introduces controlled redundancy.

At present, the best results in source (audio, image and/or video source) encoding are obtained by using discrete cosine transform (DCT) or wavelets commonly associated with VLCs. Channel encoding conventionally implements turbo-codes [1] (the bibliographical references are assembled in appendix C in order to facilitate the reading of the present description), and more generally that of the soft-decision iterative decoders. These techniques have permitted decisive progress towards the theoretical limit defined by Shannon [2].

However, the optimality of the separation between source encoding and channel encoding is guaranteed only for codes with a length tending towards infinity. Consequently, research has also been conducted to obtain, along with finite-length channel codes, joint source-channel encoding and/or decoding systems.

The invention thus relates to the decoding of entropic codes, and especially but not exclusively to the joint source-channel decoding of a system implementing an entropic code.

Combined decoding has many fields of application, for example video image transmission, especially according to the MPEG 4 (Moving Picture Expert Group) standard.

Variable length codes are well known. For example, appendix A gives a quick review of the Huffman code. The special embodiment of the invention described hereinafter can be applied especially but not exclusively to this type of entropic code.

Variable length codes are of vital importance in the limitation of the band occupied by the transmitted signal, but their use makes transmission less error-robust. Furthermore, it is difficult to use the a priori probabilities of the source when decoding, because it is not possible to know the beginning and the end of each word, since the length of these words is, by definition, variable.

A variety of techniques has been proposed for joint source-channel decoding related to the use of these variable length codes. In particular:

K. Sayood and N. Demir have proposed [4] a decoding of VLC words. The two major drawbacks of this type of decoding are found here. These are lattice complexity that increases rapidly with the number of different VLC words and decoding that remains at the symbol (or word) level;

Ahshun H. Murad and Thomas E. Fuja [5] propose a super-lattice method in which the decoding lattice is the one obtained by the product of the lattice of the channel decoder, the lattice of the source decoder and the lattice representing the source. This approach is clearly limited by the complexity of the decoding;

K. P. Subbalaskshmi and J. Vaisey [6] give a lattice structure that can be used to know the beginning and end of each word and therefore enables the use of the a priori information available on the VLC words sent. This decoder works on the words and sends no extrinsic information on the decoded bits;

Jiangtao Wen and John D. Villasenor [7] use a decoding block working on the words and sending a reliability value for the decoded sequence. This decoder uses the number of VLC words in the received sequence as a priori information.

It is a goal of the invention especially to overcome the different drawbacks of these prior art techniques.

More specifically, it is a goal of the invention to provide a technique for the decoding of data encoded with an entropic code used to obtain a reduction in the symbol error rate, especially with respect to separate (tandem) decoding schemes.

On the implementation aspects, it is a goal of the invention to provide a decoding technique of this kind with very low complexity as compared with known techniques.

In particular, it is a goal of the invention to provide a decoding technique of this kind with a reasonable operational complexity, namely one that can be implemented in practice at reasonable cost, especially when the number of different words considered by the entropic code is high.

It is also a goal of the invention to provide a technique of this kind that delivers confidence bits that can be exploited in the channel decoding operation.

In other words, it is a particular goal of the invention to provide methods of joint source-channel decoding that are well suited to the entropic codes, especially the VLCs and the RVLCs.

Yet another goal of the invention is to provide a decoding technique of this kind that improves the performance obtained with known channel codes, especially encoders implementing turbo-codes.,

BRIEF SUMMARY OF THE INVENTION

These goals as well as others that shall appear more clearly here below are achieved by means of a method for the decoding of received digital data, corresponding to sent digital data encoded by means of an entropic code associating a distinct sequence of bits with each of the words of an alphabet, the length of this sequence depending on the probability of occurrence of said word.

According to the invention, this method implements a decoding lattice for which each transition corresponds to a binary value 0 or 1 of one of the bits of a sequence of bits corresponding to one of said words.

In other words, the invention is based on a novel approach to the decoding of variable length codes, it is the transitions at bit level that are considered and not, conventionally, the transitions at the word level or the symbol level.

This approach is novel and non-obvious. Those skilled in the art are convinced that the fact that the symbols have variable length makes it necessary to work at the symbol level in order to know the beginning and end of the symbols. The inventors show that this is not obligatory.

Furthermore, the fact of working at the bit level gives a piece of information that can be exploited by a channel decoder and therefore enables joint decoding, as shall be seen more clearly here below.

Said entropic code may take the form of a binary tree comprising a root node, a plurality of intermediate nodes and a plurality of leaf nodes, a sequence of bits corresponding to one of said words being formed in considering the successive transitions of said tree from said root node up to the leaf node associated with said word. In this case, advantageously, the states of each stage of said lattice comprise a single state known as an extremal state, corresponding to said root node and to all of said leaf nodes, and a distinct state, called an intermediate state, for each of said intermediate nodes.

Thus, a simple lattice with a limited number of states is obtained.

Preferably, a piece of likelihood information is associated with each transition of said lattice. Said likelihood information is then advantageously a metric taking account, firstly of a piece of information representing the transmission channel and secondly a piece of a priori information on said entropic code.

For example, said a priori information belongs to the group comprising:

the entropic code implemented; and/or the a priori probabilities of each of said words of the code; and/or the number of words sent; and/or borderline values for the coefficients.

Thus, the following probability can be computed for each of said transitions:

$$\Gamma_i[(x_k, x_k^p), d_k, d_{k-1}] = Pr(x_k/a_k = i)Pr(y_k^p/a_k = i, d_k, d_{k-1})Pr\{a_k = i, d_k/d_{k-1}\}$$

for which the information and parameters are described here below.

Said entropic code may belong especially to the group comprising:

Huffman codes;

Reversible variable length codes (RVLC).

Preferably, in the case of an RVLC code, said a priori information is used for a forward phase in the path through said lattice and a backward phase in the path through said lattice.

The invention also relates to a method for the joint source-channel decoding of the digital signals received, based on this approach, where the source encoding implements an entropic code associating a distinct bit sequence with each of the words of an alphabet, the length of the sequence being a function of the probability of occurrences of said word.

According to the invention, this joint decoding method implements a source decoding operation using at least one decoding lattice, each transition of which corresponds to a binary value 0 or 1 of one of the bits of the bit sequence corresponding to one of said words, said source decoding operation delivering a piece of information extrinsic to the channel decoding.

The channel decoding may advantageously implement a turbo-code type of decoding that can rely on a parallel type implementation or a serial type approach.

Advantageously, the joint decoding method of the invention relies on an iterative implementation.

In this case, each of the iterations may sequentially comprise a channel decoding step and a source decoding step, said channel decoding step delivering a piece of channel information taken into account in said source decoding step, this source decoding step delivering an a priori piece of information taken into account in said channel decoding step.

In particular, the method may comprise:

a first channel decoding step;

a first source decoding step, fed by said first channel decoding step;

a second channel decoding step, fed by said first channel decoding step and said first source decoding step, through an interleaver identical to the interleaver implemented at the decoding, and feeding said first channel decoding step, through a de-interleaver symmetrical with said interleaver;

a second source decoding step fed by said second channel decoding step through said de-interleaver and feeding said first channel decoding step.

According to another aspect, the invention also relates to a method for the joint source-channel decoding of a received digital signal, where the source encoding operation implements an entropic code associating a distinct bit sequence with each of the words of an alphabet, the length of this bit sequence being a function of the probability of occurrence of said word, said method implementing a channel decoding lattice, similar to the channel encoding lattice, in which, with each state of each stage, there is associated a piece of information representing a sequence, passing through this state, of bits decoded from the past, with respect to the path direction of said lattice, designating the position of the bits considered in the tree representing said entropic code and/or a piece of information for the verification the number of decoded words and/or the value taken by said decoded bits.

In this case, the joint decoding method advantageously comprises, for each of said states, the following steps:

the addition, to the two branches coming into said state, of the channel metric and the source metric;

the comparison of the two new metrics obtained, and the selection of the shortest metric;

if said piece of information designating the position indicates the end of a word, considering the node to be a leaf of the tree, and, if not, passing on to the next node in the tree.

Preferably, this method implements an iterative procedure which may for example comprise the following steps:

a first channel decoding operation, implementing a channel decoding lattice for which each state has a piece of information available designating the position of the bits considered in the tree representing said entropic code;

a second channel decoding operation, fed by said first channel decoding, through an interleaver identical to the interleaver implemented at the decoding, and feeding said first channel decoding step, through a de-interleaver symmetrical with said interleaver;

a source decoding operation fed by said second channel decoding, through said de-interleaver.

Again, in this case, a (parallel or series) turbo-code type decoding is implemented.

Advantageously, each iteration of said turbo-code type decoding implements a block matrix, having rows and columns, on which a row decoding operation (or column decoding operation respectively) is performed followed by a column decoding operation (or row decoding operation respectively), and this a priori information is used for said row decoding operation (and column decoding operation respectively).

In this case, preferably, each row (or column respectively) corresponds to a code word formed by k information bits and n-k padding bits, and each piece of a priori information is used on said k information bits.

In particular, when the code used is an RVLC code, it is advantageous to concatenate the channel decoding and source decoding lattices, said channel decoding being controlled by a piece of a priori information on the source.

It is then possible to apply a parallel or series type of algorithm known as the "List-Viterbi" algorithm, associated with a step for the replacement of a sequence not authorized by the source, by the most probable authorized sequence, on the path through the channel decoding lattice, or an algorithm known as a "SUBMAP", in the directions of the forward and backward directions of the channel decoding lattice.

Preferably, the decoding method also implements a step to detect the end of the sequence of code words to be decoded.

This detection step may rely especially on the implementation of at least one of the techniques belonging to the group comprising:

the insertion at transmission of an end-of-sequence piece of information;

the insertion of padding bits, so that the lattice of the channel decoder associated with the sequence sent ends in a known state;

the use of the technique known as "tail-biting";

the use of a circular lattice.

Advantageously, in the different embodiments referred to here above, the method furthermore comprises a step of searching for the most probable authorized sequence by means of a reduced symbol lattice having a single initial state (d0) from which there are as many outgoing and arriving words as there are code words.

Naturally, the invention also relates to all the digital data decoding devices implementing one of the decoding methods described here above, as well as digital signal transmission systems implementing an entropic source encoding operation and a channel encoding operation at transmission and a decoding operation, as described further above, at reception.

BRIEF DESCRIPTION OF THE DRAWINGS

Other features and advantages of the invention shall appear from the following description of preferred embodiments of the invention, given by way of simple, illustrative and non-restrictive examples, and from the appended drawings, of which.

Preferred Embodiments

1-Introduction

The goal of the invention therefore is to present a decoding technique that reduces the symbol error rate, by using a priori information on the source, probabilities on the VLC code words or probabilities of transition between the words. It has been observed that this reduction is higher if the decoders use a priori information on the source at the bit level, because information on the channel decoding can be extracted only at this bit level.

Until now, most of the methods proposed for the decoding of the VLC codes work at the word level (or the symbol level, these two terms being used without distinction here below) and therefore cannot provide extrinsic information at the bit level. Furthermore these methods are, in most cases, excessively complex and therefore cannot be performed in practice when the number of different words to be transmitted increases. The only attempt made at the bit level is shown in [5]. Very clearly, this approach has very high operational complexity, and soon becomes impossible to implement.

By contrast, the technique of the invention can be used to determine not only the optimum word sequence but also the dependability associated with each of the bits of each word. To do so, the invention uses a piece of a priori information on the source, namely the a priori probabilities of the words of the VLC code, or that of the Markov transition between the words of the code.

This technique may advantageously be used in a turbo-code type iterative scheme and improve transmission performance.

2-Notation

Hereinafter, the following notation is used:

a soft decision corresponds to a non-binary real decision. A threshold-setting operation on this decision will give a hard decision.

the ratio $E_b/N_O$ corresponds to the ratio between the energy received per useful bit divided by the monolateral spectral density of the noise;

the DC (Direct Component) band of an image is the direct component of the image after transformation by wavelet or DCT.

A bit sequence received is referenced by X or Y. This sequence consists of words referenced $x^i$, these words consisting of bits referenced $x^i_j$;

the notation $p(a)=Pr\{x^i=a\}$ is used an RVLC <<Reversible VLC>> [8] is a variable length code whose words are decoded in both directions a SISO (<<Soft-In Soft-Out>>) has soft values as inputs and delivers soft outputs.

3-Soft Source Decoding of Variable Length Codes

Appendix B shows how it is possible to extract information from the variable length word sequences sent by a Huffman encoder (see appendix A), by modeling the source either by a random process generating independent symbols or by a Markovian random process.

Figure 1:
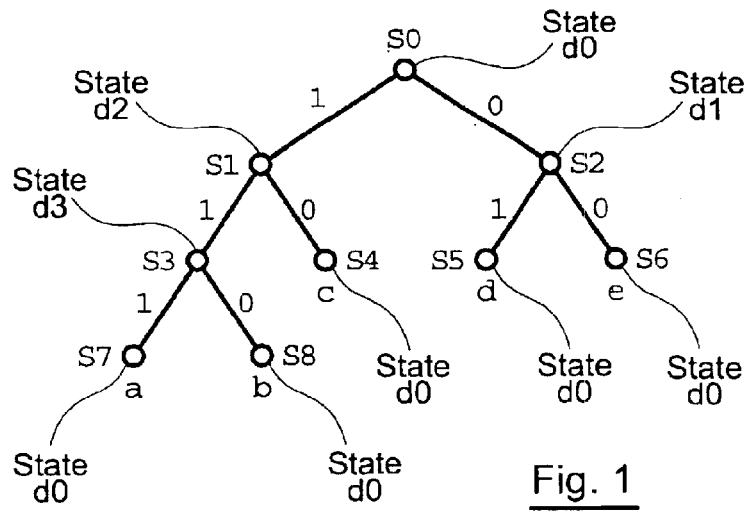
FIG. 1 shows an exemplary Huffman code in the form of a binary tree.

FIG. 1 shows an exemplary Huffman code in the form of a binary tree. It consists of five words a, b, c, d, e with probabilities p(a), p(b), p(c), p(d), and p(e), and respective lengths 3, 3, 2, 2 and 2.

The corresponding encoding table is given here below:

TABLE 1 table of the VLC codes of the tree of FIG. 1.

| | |
|---|---|
| a | 111 |
| b | 110 |
| c | 10 |
| d | 01 |
| e | 00 |

Table 1: table of the VLC codes of the tree of FIG. 1.

Figure 2:
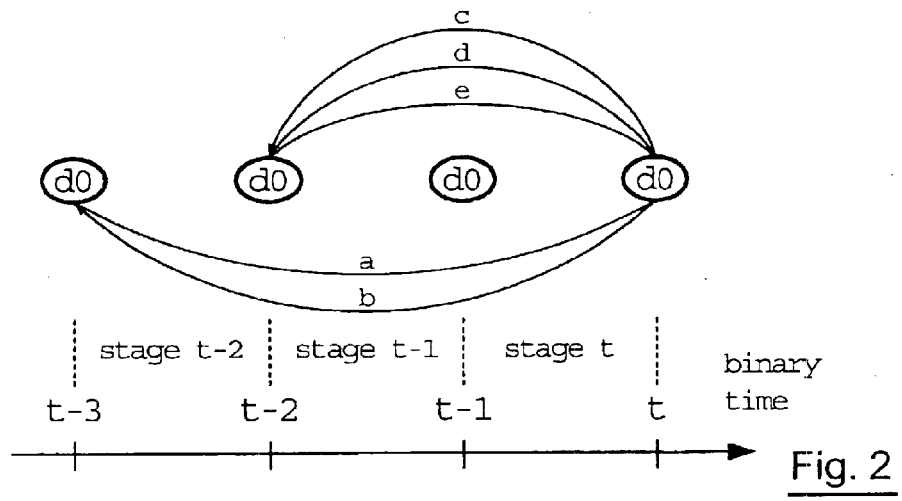
FIG. 2 illustrates a symbol lattice according to the invention, known as a reduced symbol lattice, corresponding to the tree of FIG. 1.

If we look at the bit level, according to the approach of the invention, we see that four states are needed to describe the tree of FIG. 1 in lattice form. These states are d0 for the beginning and the end of the symbols, d1, d2 and d3 for the intermediate positions. However, at the symbol level, it is observed that only one state d0 may suffice, as shown in FIG. 2. The reduced symbol lattice thus defined is then a lattice with a single state d0, from which there are as many outgoing and arriving branches as there are VLC words in existence. In the example of FIG. 1, at each stage (t-2, t-1, t), this lattice has five branches corresponding to the words a, b, c, d and e.

The reduced lattice symbol uses the a priori probabilities on the words of the source, in working at the word level. This lattice may also be used as a complementary lattice during the decoding using the Markov probabilities. As shall be seen here below, this reduced lattice may advantageously be implemented as a complement to the decoding of the invention.

4-Decoding According to the Invention at the Bit Level

It has been seen that, according to prior art techniques, the method for decoding a VLC source used the a priori probabilities of the VLC words at the word level. This averts the need to send dependability values on each bit of the decoded sequence. It is shown hereinafter how the a priori probabilities on the words may be broken down into a product of a priori probability on the bits. Then, the decoding methods that relay on this approach are described.

4.1 Use of the a Priori Probabilities of the VLC Code Words at the Bit Level This part explains the breakdown of the probabilities of the words into a product of binary probabilities.

Let us take the example of the word a: According to the tree of FIG. 1 we have:

$$p(a) = Pr\{x^i = a\} = Pr\{x_0^i = 1, x_1^i = 1, x_2^i = 1\} \quad (8)$$

This probability cab be broken down according to the equation:

$$p(a) = Pr\{x_0^i = 1\} Pr\{x_1^i = 1/x_0^i = 1\} Pr\{x_2^i = 1/x_0^i = 1, x_1^i = 1\} \quad (9)$$

The probability p(a) is therefore the product of three probabilities associated with each of the bits of the word a.

With a lattice that indicates the position of the bit in the word that is decoded, these binary probabilities are used to carry out binary "soft" decoding.

$$Pr(x_1^i = 1/x_0^i = 1)$$

For example, if it is known that we are in the second position of the word a, then the probability to be used on the branch is:

$$Pr\{x_k^i = +1/(x_j^i = +1, j < k)\}$$

Let us calculate, for the word a and for k=0,1,2 the probabilities for the word a.

$$Pr\{x_0^i = 1\} = Pr\{top_{i,0} = S1\} = p(a) + p(b) + p(c) \quad (10)$$

The tree of FIG. 1 immediately gives the solution. The following equalities are deduced therefrom at the different treetops:

$$Pr\{x_1^i = 1/x_0^i = 1\} = Pr\{top_{i,1} = S3/top_{i,0} = S1\} = \frac{p(a) + p(b)}{p(a) + p(b) + p(c)} \quad (11)$$

$$Pr\{x_2^i = 1/x_0^i = 1, x_1^i = 1\} = \quad (12)$$

$$Pr\{top_{i,2} = S7/top_{i,1} = S3\} = \frac{p(a)}{p(a) + p(b)}$$

This computation can easily be generalized to the case of a real Huffman code. Let $C = (w^i)$ be the set of Huffman code words, $S_k = \{n \in N | \forall p < k, w_p^n = x_p^i\}$ the set of the indices of the words whose k first bits are equal to the k first bits of the word $x^1$ and $S_k^1 = \{n \in S | w_k^0 = s\}$ the indices of $S_k$ of the words whose $k^{th}$ bit is equal to $s (s \in \{0,1\})$, we have:

$$Pr\{x_k^i = S | x_{p(p<k)}^i\} = \frac{\sum_{l \in S_k^1} Pr(wt)}{\sum_{l \in S_k} Pr(wt)} \quad (13)$$

The principle of computation is illustrated here in the case of a source of independent words. For a Markov source, the principle is the same except that each distribution of the probabilities computed depends on the previous word found. Thus the computation has to be made for all the previous words possible.

Once this breakdown has been made for all the words of the VLC code, the reduced binary lattice enabling the use of the binary probabilities has to be found. The breakdown of p(a), p(b), . . . into a product of binary probabilities has dictated a certain relationship between the binary probabilities and the probabilities of the words. These relationships are kept only if there is bijection between the branches of the tree and those of the lattice. The lattice should have the least possible complexity that gives the position of the bits in each word and avoids the identical parallel branches (i.e. branches with the same starting state, same arrival state and same label

4.2 The Reduced Binary Lattice (Called<<SISO-huff>>)

First of all, we shall describe the construction algorithm of the reduced binary lattice. Then, we shall give the decoding algorithm on this lattice and especially the use of a priori binary probabilities.

4.2.1 Algorithm for the Construction of a Reduced Binary Lattice Initialization of the Lattice First state of the lattice, state 0: origin of the tree i=1 construction loop

{

For each word of the VLC table,

For each bit of this word, construction of the states

If the starting state of the branch of the tree labeled by this bit is not associated with a state of the lattice, add a state lattice, state I i++

If the arrival state of the branch is not associated with a state of the lattice, If it corresponds to a non-terminal node of the tree, Add a state to the lattice, state j(j==i)

i++

Else, associate this state with the state j(j=0)

Labeling of the branches

Create, if non-existent, a branch between the state i and the state j labeled by the processed bit}

{

Figure 3:
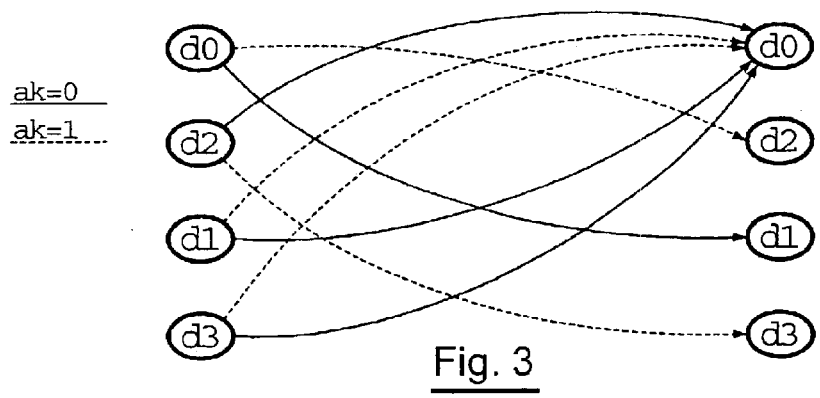
FIG. 3 illustrates a binary lattice according to the invention, known as a reduced binary lattice, corresponding to the tree of FIG. 1.

In the case of our example, the lattice of FIG. 3 is thus obtained.

This lattice gives the position of the bit in the word. If the current state is the state i, it is known, from the tree, that the current position is the position j of the word processed because there is a bijective correspondence between the states i of the lattice and the positions j in the tree.

4.2.2 Decoding Algorithm for Decoding From Reduced Binary Lattice

The decoding algorithm used on this lattice for the simulations given here below is an algorithm of the BCJR (Bahl Cocke Jelinek Raviv) [13] modified by Benedetto in [14] to process the parallel branches.

The metric computed on each branch takes account of the available knowledge on the channel and the binary a priori probabilities computed earlier. More specifically, the formula of computation on a branch [15] is:

$$\Gamma_i\,[(x_k,x_k^P),d_k,d_{k-1}]=Pr(x_k/a_k=i)Pr(y_k^P/a_k=i,d_k,d_{k-1})\,Pr\{a_k=i,d_k/d_{k-1}\} \quad (14)$$

At the discrete instant k, the pair $(x_k,x_k^P)$ is the pair of likelihoods of the bits received, $d_{k-1}$ and $d_k$ are respectively the outgoing and arrival states of the branch, $a_k$ is the information bit associated with the branch.

The first two terms of the straight line of the equation (14) refer to the knowledge available on the channel. The third term, $Pr\{a_k=i,d_k d_{k-1}\}$ corresponds to the a priori binary probability.

More generally, this a priori information on the source may be of many types:

either it corresponds to knowledge of the table of the Huffman code, reversible (RVLC) or not. In this case, the a priori information consists of probabilities belonging to the set {0,1,0.5}.

or it corresponds to knowledge of the table of the Huffman code, reversible or not, and of the probabilities of the associated words. In this case, it consists of probabilities belonging to the segment [0,1];

or it corresponds to the knowledge of the number of the words sent, the number of bits or the borderline values that can be taken by the coefficients.

This lattice can be used in a soft binary decoding of the BCJR or SOVA ("Soft Output Viterbi Algorithm") type. During the use of the Markov a priori probabilities, if the BCJR algorithm is used, the soft decoding calls for a parallel processing operation that indicates the most probable preceding word for each stage. This processing is the one achieved by the reduced symbol lattice. This increase in complexity implies a preference for the SOVA algorithm or for the SUBMAP algorithm [11].

4.2 Generalizations

The method presented can be extended, without difficulty, to the case where the Huffman table contains more bits. However, the complexity of the reduced binary lattice increases with the number of words of the Huffman table.

The application of the method of the invention to the RVLC codes [8] may of course be envisaged. The lattice of the <<SISO_huff>> block may be used by decoding in the other direction, but this implies an increase in complexity. One alternative would be to use the a priori probabilities in one direction for the "forward" phase and in the other direction for the "backward" phase.

Furthermore, it is useful to make a search among the equivalent Huffman codes [17], for the one best suited to the soft decoding of the "SISO_huff" block.

Figure 4:
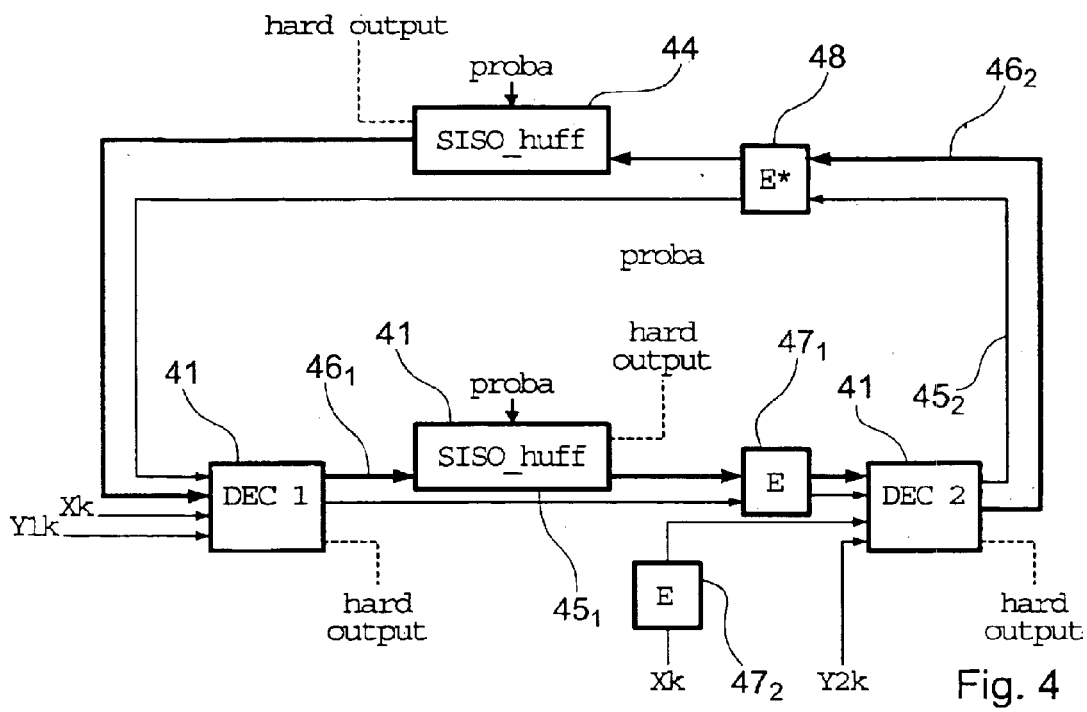
FIG. 4 is a drawing illustrating a joint turbo-code type of decoding structure, implementing a "SISO_huff" module according to the invention.

5-Joint Source-Channel Decoding 5.1 Principle of the Use of the "SISO_Huff" Block The reduced binary lattice or "SISO_huff" is used for a SISO type decoding and can therefore be inserted into an iterative decoding scheme like that of FIG. 4.

Each decoding block 41 to 44 of FIG. 4 extracts extrinsic information on the bits to be decoded and sends this information to the next block. The pieces of information that flow between the different blocks are, as in the reference [15], extrinsic probabilities.

From the two channel decoders DEC1 and DEC2, 41 and 43, two different pieces of extrinsic information are extracted depending on whether they are used by the "SISO_huff" block 42 or 44 or by the other channel decoder 41 or 43. The extrinsic information 451, 452 used by the next channel decoder is the one conventionally used in the turbo-codes. The one used by the "SISO_huff" block 42, 44, shown in bold characters, 461, 462 corresponds to this first piece of information from which the information derived from the previous block "SISO_huff", 44, 42 has been removed. This was done in order to follow the rule according to which no iterative decoding block must use a piece of information that it has already produced.

The overall structure of the iterative decoder is not discussed in greater detail. It is known per se [1]. The modules E47$_1$ and 47$_2$ are interleavers (identical to those implemented in the encoding operation) and the module E*48 is a de-interleaver symmetrical with the interleaver.

The following pieces of information are taken into account:

$X_k$: Likelihood information received on the information bits sent;

$Y_{1k}$: Likelihood information on the parity bits coming from the encoder 1;

$Y_{2K}$: Likelihood information on the parity bits coming from the encoder 2;

Proba: a priori probability;

Hard_output: decoded information bit.

This scheme is an exemplary iterative joint decoding system where the a priori information and the information of the channel are used in turn on their associated lattice. It can also be planned to make joint use of these two pieces of information on the lattice of the channel decoder as can be seen in the second method proposed.

5.2 Second Joint Source-Channel Decoding Algorithm

The joint decoding proposed in FIG. 4 performs the two decoding functions iteratively and sequentially. Here below, a technique is presented in which a single decoding block carries out both operations simultaneously. This technique can be applied also to the decoding of a Markov source.

The concept developed can be applied to any transmission chain formed by a (convolutional or block) channel decoder lattice and a source that can be represented by a tree.

5.2.1 Algorithm for the Construction of the Lattice

The lattice used is that of the channel encoder and requires no new construction.

5.2.2 Decoding Algorithm

The decoding algorithm is a Viterbi type algorithm. It decodes the most probable word sequence. The computation of the metric brings into play not only the information on the channel (this is the usual case) but also the binary a priori probabilities.

More generally, with each state of each stage, there is an associated piece of information dependent on the sequence (passing through this state) of the past decoded bits with respect to the lattice path direction. This information may designate especially the position of the bit considered in the tree representing said entropic code. It may also be, for example, a verification of the number of decoded words or of the value taken by the decoded coefficients.

This method is similar to the one presented by Hagenauer [15] but is applied here to variable length codes.

To this end, the algorithm must know which branch of the Huffman tree corresponds to the branch currently being processed on the channel decoder. This information is enough for it to give the appropriate binary a priori probability (computed as in paragraph 4.1 and stored beforehand in the table).

This piece of information can easily be accessed by keeping the position of the bit in the tree up to date for each stage and each state of the lattice of the channel decoder.

For each stage of the channel decoder,
For each state,
{
ACS (Add Compare Select) field
add the metric of the channel and the metric of the source to the two branches coming into the state
compare the two new metrics obtained, and choose the smallest metrics updated
if the end of a word is reached,
node=root of the tree
else
node=next node in the tree
{

Figure 5:
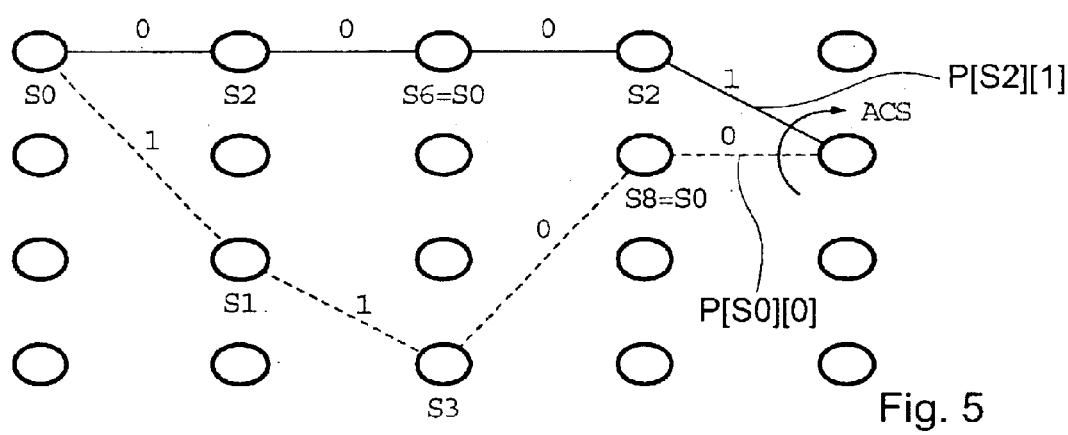
FIG. 5 illustrates the progress of the joint source-channel decoding algorithm according to a second mode of implementation.

Let us again take the example of the tree of FIG. 1. The algorithm runs as shown in FIG. 5. At the stage considered, the two concurrent sequences reaching the second state of the letters. Each sequence corresponds to a stringing of different VLC words. The first word, represented by a solid line, corresponds to the sending of e, d, . . . , the second word represented by dots corresponds to b, e, . . . The a priori branch probability for each of them, P[S2][0] and P[S0][1], depends on the node Si noted in the sequence and on the bit 0 or 1 that labels the branch. Once the probability of the branch has been computed, by the relationship (6), the classic ACS can be done.

This approach is very valuable because, unlike the solution of the "SISO_huff" block, it is not limited in complexity by the size of the Huffman table and it increases the present complexity of channel decoders only to a very small extent.

6-Application of the Second Algorithm to an Iterative Joint Decoding Scheme

6.1 The Use of this Method in an Iterative Scheme

Figure 6:
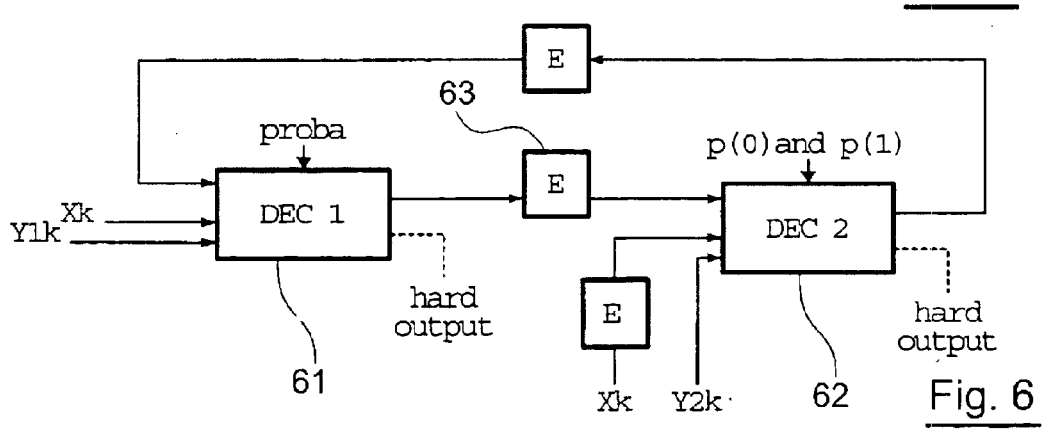
FIG. 6 shows an iterative scheme of joint decoding implementing the algorithm illustrated in FIG. 5.

A scheme for use in an iterative decoding operation is shown in FIG. 6. The first decoder 61 uses the channel information and the a priori information on the same lattice. However, the second decoder 62 cannot use the a priori information because the interleaver 63, referenced E, breaks the relationships between the VLC code words. This interleaver uses the probabilities p(0) and p(1) which in most cases are different.

6.2 Total of the Two Joint Decoding Approaches

Figure 7:
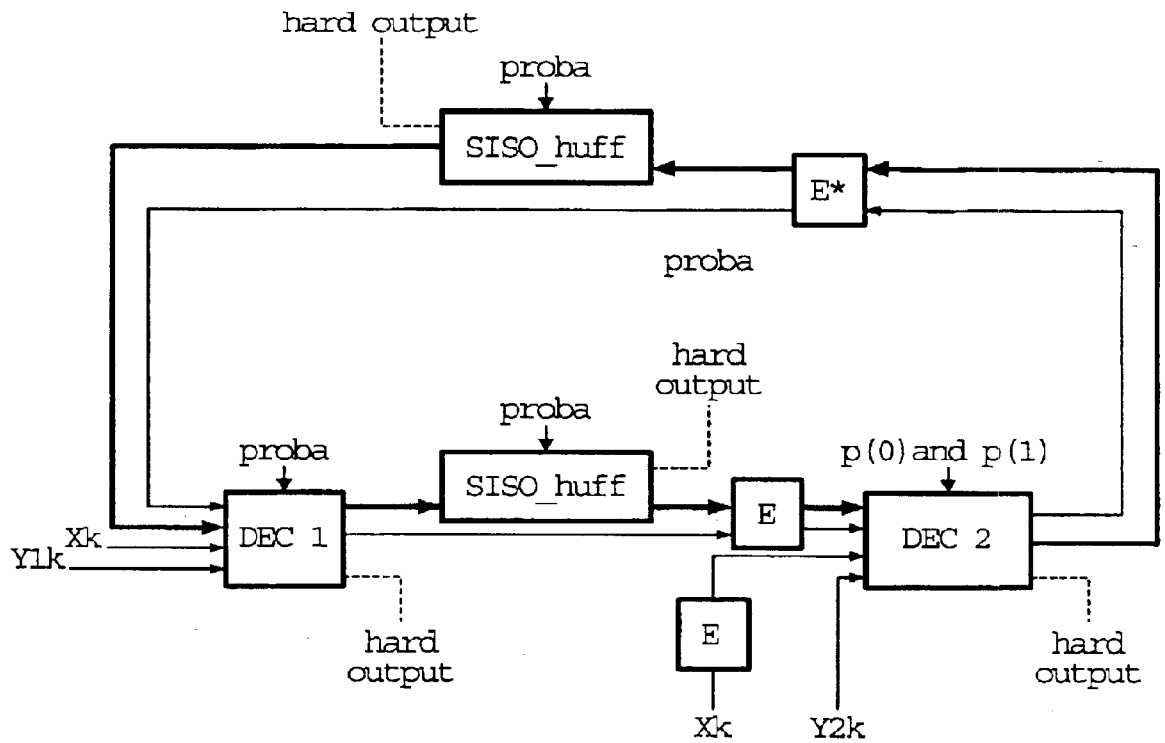
FIG. 7 shows a combination of the methods of FIGS. 4 to 6.
Figure 8:
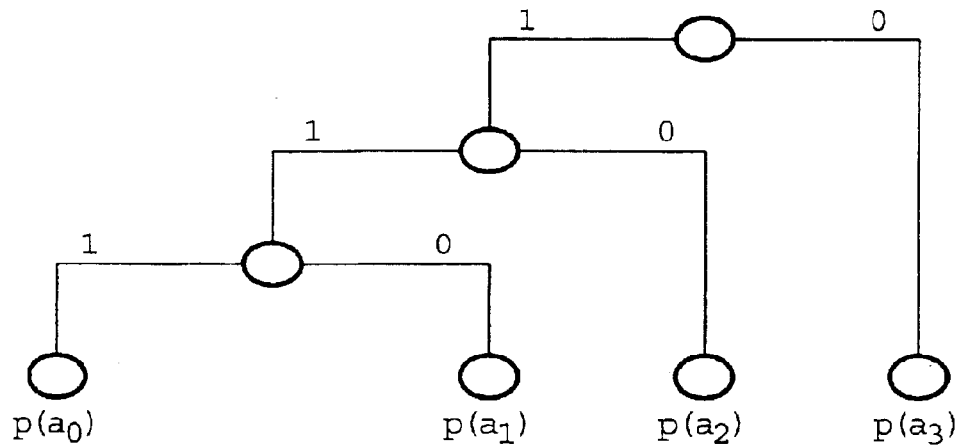
FIG. 8, commented upon in the appendix A, illustrates the construction of a Huffman code.

Both methods proposed here above can be used in an iterative scheme, such as the one given by way of an example in FIG. 7. In this figure, the notations are identical to those used here above.

The preparation of an interleaver that maintains the relationships between the words provides for a compromise between optimal binary interleaving and preservation of the a priori structure on the words.

7-Case of the Turbo-Codes in Blocs

Each iteration of the turbo-codes in blocks comprises a soft (weighted-decision) decoding of the rows and then a soft decoding of the columns (or vice versa). The method described here below is used in the same way, whether the a priori information is used on a row decoding operation or on a column decoding operation. It must be noted, in the same way, that for convolutional turbo-codes, the a priori information can be used only in one direction (row or column) because the interleaver breaks the order of the bits for the other direction.

Each row (or column) of the block matrix corresponds to a code word. For a code with a yield of k/n, a code word contains k information bits and n-k redundancy bits.

If the set of the k first bits is referenced K and the set of the n-k parity bits is referenced M, the equation of the a priori probability of a code word C becomes:

$$P(C) = P(K, M)$$
$$= P(K) \times P(M/K)$$
$$= P(K)$$

The a priori information is therefore used on the k first bits of each code word.

It is deduced therefrom that the probability of a word is given by the following:
if the words sent by the source are independent:

$$P(C) = \prod_i \prod_j p(x_j^i / x_{k(k<j)}^i).$$

if the words sent follow a first-order Markov process, as for example in the case of a sub-band image encoder as regards the direct component:

$$P(C) = \prod_i \prod_j p(x_j^i / x_{k(k<j)}^i, x^{i-1})$$

Figure 9:
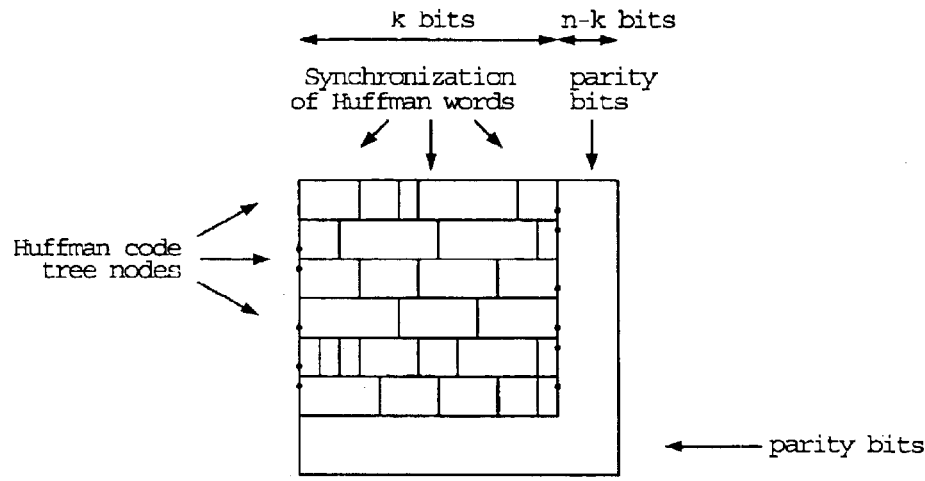
FIG. 9 shows the Huffman code block turbo-decoding matrix.

At the end of each group of k bits, the node of the tree of the Huffmann code that has been reached must be kept in memory so that it can be used for the decoding of the following group of k bits as illustrated in FIG. 9. This information can be sent in order to be certain of the node from which there is a departure at each start of a code word. However, that would reduce the compression correspondingly.

It must be noted that the general decoding scheme of the turbo-codes is the same, whether block turbo-codes or convolutional turbo-codes are used. The difference lies in the interleaver and in each of the two decoders DEC1 and DEC2.

8-Case of the RVLC Codes

A description is given here below of a variant of the invention, implementing a method for the decoding of RVLC codes using a piece of a priori information on the source.

A particular feature of this method is the use of a priori information on the source during the forward and back phases of the lattice path, by means of the property whereby RVLC codes are decoded in both directions.

8.1-State of the Art in RVLC Decoding

To increase the robustness of the variable length codes, RVLC codes [8] have been proposed.

The RVLC codes are an extension of the Huffmann codes. They verify the condition known as the prefix condition in both directions. Thus, whether a RVLC word sequence is taken in one direction or the other, this binary sequence can never represent an encoded element and, at the same time, constitute the start of the code of another element. This dual property causes a loss in compression level and dictates constraints during the making of a Huffman code. It must be noted that the RVLC codes may be symmetrical or asymmetrical.

The following example shows the case of a symmetrical four-word RVLC code.

| word | prob. | Encoding |
| --- | --- | --- |
| $a_0$ | $p(a_0)$ | 010 |
| $a_1$ | $p(a_1)$ | 101 |
| $a_2$ | $p(a_2)$ | 11 |
| $a_3$ | $p(a_3)$ | 00 |

Furthermore, some methods for decoding these codes have already been described:

R. Bauer and J. Hagenauer [20] propose an iterative flexible decoding binding the channel decoder and the source decoder, which is a lattice used at the bit level representing the RVLC code.

J. Wien and J. Villasenor [21] give a simple means of using the properties of reversibility of the RLVC codes in working on the hard values of the bits.

8.2-State of the Art for the Decoding of the VLCs With the List-Viterbi Algorithm Through the use of the List-Viterbi algorithm, the sequences can be classified and memorized in the order of probability of occurrence. This storage enables the use of certain sequences when the most probable sequence does not verify an a priori condition.

This algorithm has been used by Murad and Fuja for the decoding of the VLC codes when the decoder knows the number of words sent in reception [22], [23].

8.3-Hard and Soft Source Decoding of the RVLC Codes 8.3.1-Hard Decoding of the RVLC Codes During the decoding of a noisy VLC or RVLC word sequence, certain errors may be detected to stop the decoding of the corresponding frame. These errors are of many types [24]:

value exceeding existing limits;
RVLC word outside the existing table;
number of words detected exceeding the expected number.

The first two types of errors correspond to the decoding of a word that does not exist in the Huffmann table.

The error detection makes it possible to stop the decoding and roughly localize the error. With the VLC codes, the rest of the frame is considered to be lost. With RVLC codes, it is possible to start the decoding in the back direction by starting from the end (in assuming that it is known where the sequence ends) until the detection of an error. The use of RLVCs thus makes it possible to recover a part of the information. A possible decoding strategy is summarized in [22]. This strategy distinguishes between the cases where the decoding operations in the forward and backward directions detect an error and those where they do not detect it.

One approach to overcoming the first two types of errors consists in carrying out a hard decoding operation by making a search, from among the authorized sequences, for that sequence which is best correlated with the received sequence. This search is made by means of the reduced symbol lattice, which has already been commented upon.

8.3.2-Joint Source-Channel Soft Decoding of the RVLC Codes

Up till now, several methods have been proposed for the joint source-channel decoding of the VLC and RVLC codes.

The optimal method which, however, is highly complex, is that of the multiplication of the channel and source lattices [5].

A sub-optimal method is that of the serial arrangement of the channel and source lattices described further above, possibly separated by an interleaver if the algorithm is iterative [20]. This method soon becomes complex with the number of words in the VLC or RVLC table.

Another method of very low complexity envisages the concatenation of the two lattices. The channel decoding is then controlled by the use of the a priori information on the source, as proposed further above.

The three methods may be used in jointly with the turbo-codes, but only the last two can be envisaged in terms of compromise between gain and computation complexity.

A first new method according to the invention is based on the last method referred to for decoding VLCs and extends it to RVLC codes by using a parallel or series types List-Viterbi algorithm [25]. The necessity of the List-Virterbi algorithm for the decoding of the RVLC codes can be explained by the fact that, unlike in the case of the decoding of VLC codes, the sequences are not all authorized at reception. Storage of the most probable authorized sequences enables them to be reused for the replacement of an unauthorized sequence during the decoding phase along the lattice of the channel decoder.

This new method can be extended also to the case of the decoding of the VLCs or RVLCs applied to real data for which, for example, there is an additional piece of a priori information on the number of words of the sequence, on the interval of values that the coefficients may take.

Figure 10:
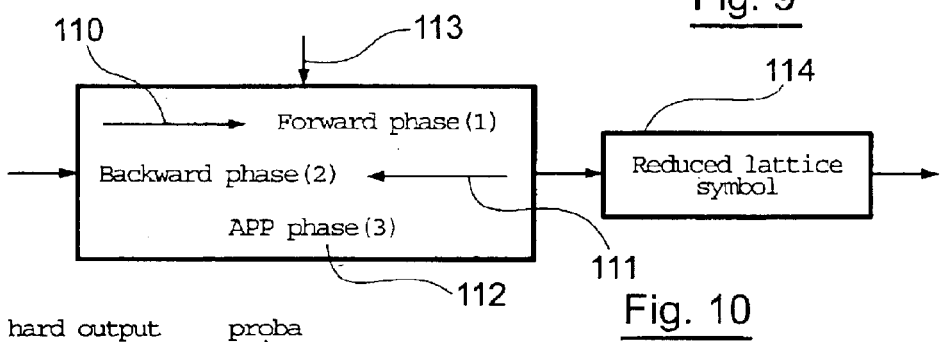
FIG. 10 illustrates a joint decoding of RVLC codes.

A second new method for the decoding of the RVLC codes consists in using the equivalent of the List-Viterbi algorithm for the algorithm of the SUBMAP [26], in both directions of decoding, as shown in FIG. 10. The usefulness of working with the algorithm of the SUBMAP arises out of its mode of operation.

This algorithm can be subdivided into three phases:
"forward" phase 110 decoding the sequence in one direction;
"backward" phase 111 decoding the sequence in the other direction;
a posteriori probability (APP) phase 112 using the results of the previous two phases to returning the APP of the decoded bits.

The decoding of the RVLCs is also done in both directions through their two-direction decoding property. The analogy between channel encoding and source encoding shows that a combination of these two methods may prove to be beneficial. Thus, during the decoding of the sequence received at the lattice of the channel decoder, each decoding direction may use its a priori information 113. To make the best possible use of the a priori information in the backward direction, it is useful to know which is the final state of the lattice. This information is obtained either by transmitting it or by placing padding bits or by using the "tail-biting" or the circular lattice technique [27].

The a priori information used may be of two types, as already mentioned.

Once the soft channel decoding has been done by using the a priori information, the soft sequence obtained is not necessarily an authorized sequence because, although the forward and the backward phases guarantee this condition, the APP phase does not guarantee it. It is then advantageous to have this channel decoding checked by the source of a reduced symbol lattice 114 giving the most probable authorized sequence.

8.4 Soft Source-Channel Decoding Using Turbo-Codes

The decoding method referred to here above can be applied advantageously to a turbo-code type scheme. The channel encoder is then replaced by the turbo codes. This makes it possible to keep the gain obtained at low signal-to-noise ratios throughout the range of signal-to-noise ratios.

Figure 11:
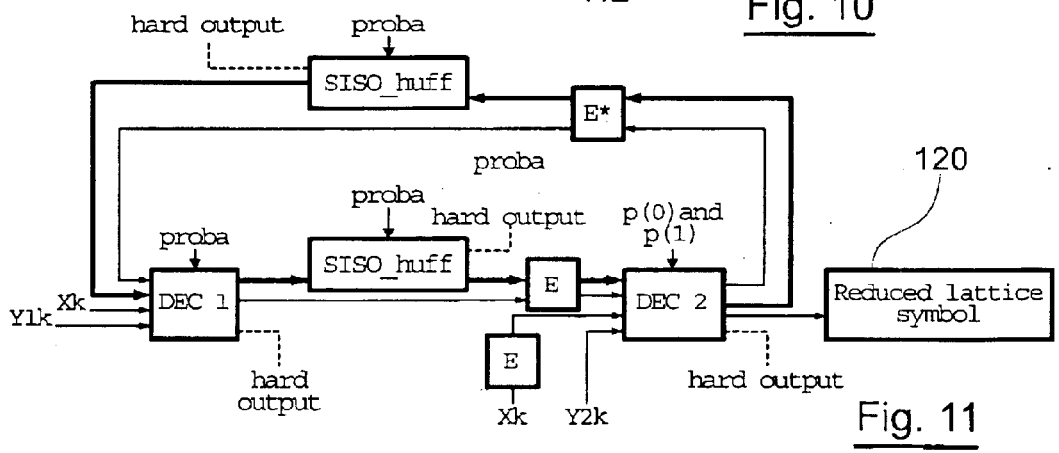
FIGS. 11 and 12 show two modes of implementation of a joint decoding of RVLC codes with turbo-codes, with the use of a reduced lattice.

In the first method, the source lattice 120 is used in series with the two decoders as can be seen in FIG. 11.

Figure 12:
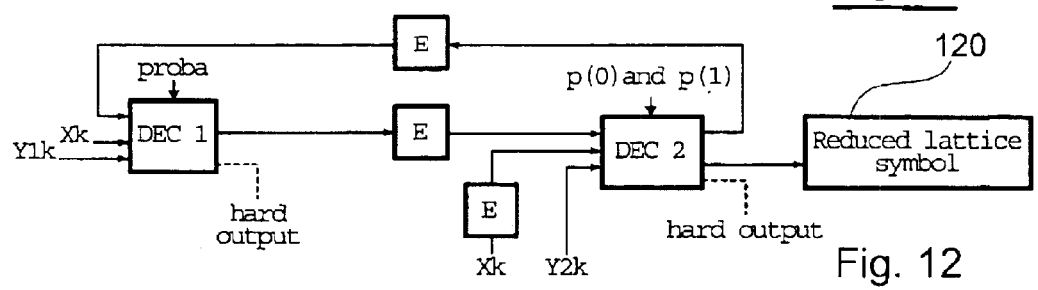

The second method takes up the second principle described further above: the channel lattice uses the a priori information directly as explained in FIG. 12. Just as in the case of the previous part, to make the best possible use of the a priori information in the "backward" direction, it is useful to know the final state of the lattice. This information is obtained either by transmitting it or by placing padding bits or by using the technique of circular encoding. This technique is, to the Recursive Systematic Codes (RSC), what the "tail-biting" technique is for the Non Systematic Codes (NSC) [28].

9-Performance

The possibility of carrying out a soft decision decoding of the Huffmann codes has been shown. As compared with already published work, the method of the invention makes it possible to work at the bit level. A source decoding block with weighted inputs and outputs, called a "SISO_huff" can thus be introduced into a turbo-code type of channel decoding scheme. Another possibility is to use the a priori information on the source directly at the channel decoder. This second method is appreciably less complex and gives results equivalent to those obtained with "SISO_huff".

The gains given by this type of scheme depend firstly on the modeling used for the source with a priori knowledge of the probabilities of the Huffman symbols or of their probabilities of transition, and secondly, of the ratio $E_b/N_o$ on the channel.

In the comparisons that we have made, we assess our gains with respect to the corresponding tandem scheme. In the range of binary error rates around $10^{-2}$ to $10^{-3}$, both new techniques provide gains of 0.5 to 1 dB starting with their first iteration, and achieve this with NSCs (or Non Systematic Coder).

Furthermore, their use in a turbo-code type of iterative scheme improves performance by 0.5 to 1.5 dB. The gain depends on the S/N ratio and on the residual redundancy. Furthermore, the joint use of both methods provides for an even greater cumulative gain.

In the spreads of gain values announced, the highest values are obtained at low signal-to-noise ratios. This considerably increases the range of operation in transmission. It must also be noted that, in a turbo-code type scheme, this can provide for a corresponding shift, hence a 0.5 to 1.5 dB shift, in the point of activation of the turbo-code effect.

The first method requires the running of the decoding algorithm on the "SISO_huff" lattice while the second method simply requires an updating of a table during the decoding on the lattice of the channel decoder. Furthermore, unlike the first method, the second method has a computation complexity that does not increase with the number of words in VLC table.

Since the use of Huffman type variable length codes is very widespread, these decoding techniques may be suited to many contexts. The applications are numerous. Huffman tables are found for example in the MPEG4 standard for the encoding of DC band and AC band coefficients for intra-coded images as well as for motion vector encoding.

The invention can also be used in a more full-scale transmission system taking account of a standard-compliant or near-standard-compliant system of image encoding, and a channel model representing the radio-mobile channel such as the BRAN (<<Broadcast Radio Network>>).

Appendix A

The Huffman code ([18]) is an entropic code that compresses a source by encoding data with low probability on a binary length greater than average and encodes words with high probability on a short binary length. The Huffman code is much used because there are no other integer codes (codes whose symbols are encoded on a whole number of bits) that give a lower average number of bits per symbol. One of its essential characteristics is that a binary sequence can never represent an encoded element and, at the same time, constitute the beginning of the code of another element. This characteristic of Huffman encoding enables representation by means of a binary tree structure where the set of words is represented by the set of paths from the root of the tree to the leaves of the tree.

There are many ways of representing the construction of the Huffman code. The method that appears to be the simplest one is based on the tree structure.

Let us take N words $a_i$ with respective probabilities $p(a_i)$. The tree is built from its N terminal tops.

Each terminal top i is assigned the probability $p(a_i)$ and will provide for the binary breakdown of the word $a_i$.

The algorithm for the construction of the tree consists, in each step, in summing up the two lowest probabilities of the previous step to join them at a top assigned the sum probability.

At the last step, the top with the probability 1 is obtained. This is the root of the tree.

What remains to be done is to label the branches of the tree obtained by indexing the right-hand branches of each top with 1 and the left-hand branches with 0. The binary breakdown of the word $a_i$ is then obtained by going down the tree from the top with the probability 1 to the top i.

The example explained takes the case of four words as shown in FIG. 6.

Table 1

| Example of Huffman table | | |
|---|---|---|
| Word | Probability | Binar Code |
| $a_0$ | $p(a_0)$ | 111 |
| $a_1$ | $p(a_1)$ | 110 |
| $a_2$ | $p(a_2)$ | 10 |
| $a_3$ | $p(a_3)$ | 0 |

Appendix B

Source Decoding of Independent or Markovian Symbols

Two optimal structures are used for the decoding of an encoded sequence. Each is based on a different criterion, the criterion of the most likely sequence or the criterion of the most likely symbol commonly called the MAP (maximum a posteriori) criterion

1. Viterbi Algorithm

The search for the most likely sequence is made with the Viterbi algorithm [9] which seeks the most probable sequence X emitted, the sequence Y received being known:

$$\max_X P(X/Y) \quad (1)$$

Since the logarithmic function is strictly increasing, it is equivalent to maximizing log P(X/Y)

$$\max_X \log P(X/Y) \quad (2)$$

By applying Bayes's law $$P(X/Y)P(Y) = P(Y/X)P(X) \quad (3)$$

The criterion becomes:

$$\max_X [\log P(Y/X) + \log P(X)] \quad (4)$$

The a posteriori information on X can these broken down into two terms. The first log P(Y/X) relates to information given by the channel, and the second log P(X) relates to the a priori information on the sequence sent.

If the noise samples of the channel are independent, then the law of the noise P(Y/X) can be expressed as the product of the laws of probabilities of the noise disturbing each of the words $x^i$ and $y^i$ and of the transmitted bits $x^i_j$ and $y^i_j$.

$$\log P(Y/X) = \log \prod_i \prod_j p(y^i_j/x^i_j) \quad (5)$$

With respect to the a priori probability P(X), the two assumptions considered are:

the words sent by the source are independent $$\log P(X) = \log \prod_i p(x^i) \quad (6)$$

$$= \sum_i \log p(x^i)$$

the words emitted follow a first-order Markov process as for example in the case of a sub-band image encoder with regard to the DC component. We then have:

$$\log P(X) = \log \prod_i p(x^i/x^{i-1}) \quad (7)$$

$$= \sum_i \log p(x^i/x^{i-1})$$

Classically, the decoding according to the Viterbi algorithm comprises an ACS (Add Compare Select) phase: at each stage and in each state, the metric of the branch associated with each of the two concurrent sequences is added up, the two metrics obtained are compared and the lowest metric sequence is selected.

2. The MAP Algorithm

The decoding according to the MAP algorithm is done according to the following rule $$\hat{x}^i_j = \begin{cases} +1 & p(x^i_j = +1/Y) > p(x^i_j = -1/Y) \\ -1 & \text{else} \end{cases}$$

The computation of the probability $p(x^i_j = +1/Y)$ is complex. This complexity may be reduced at the cost of impaired performance. The less complex algorithm is called the SUBMAP algorithm [11].

3. Weighting of the Decisions of the Decoder

This weighting is a piece of dependability information on the estimation made by the decoder. This "soft" piece of information, sometimes called extrinsic information, can be used by an external decoder, a source decoder or any other device coming into play in the reception of the information [12].

Several algorithms give weighted decisions on the decoder values:

- the SOVA (Soft Output Viterbi Algorithm) [13] is based on a slight modification of the Viterbi algorithm.
- The BCJR (Bahl Cocke Jelinek Raviv) [14] algorithm is established on the MAP criterion.

A VLC encoded source or a source coming from a channel encoder may be represented by a lattice from which the extrinsic information can be extracted. A part of the invention proposes to build a lattice of this kind from the VLC code of the source.

Appendix C

RÉFÉRENCES

[1] C. Berrou, A. Glavieux, and P. Thitimajshima "Near Shannon limit error-correcting coding and decoding: Turbo-Codes". *Proceeding of ICC*, pages 1064–1070, May 1993.

[2] C. E. Shannon. "*A Mathematical Theory of Communication*", volume 27. Bell System Tech. J., 1948.

[3] S. B. Zahir Azami. "*Codage conjoint Source/Canal, protection hiérarchique*". PhD thesis, ENST Paris, May 1999.

[4] N. Demir and K. Sayood. "Joint source/channel coding for variable length codes". In *Data Compression Conference (DCC)*, pages 139–148, Snowbird, Utah, USA, March 1998.

[5] A. H. Murad and T. E. Fuja. "Joint source-channel decoding of variable length encoded sources". In *Information Theory Workshop (ITW)*, pages 94–95, Killarney, Ireland, June 1998.

[6] K. P. Subbalakshmi and J. Vaisey. "Joint source-channel decoding of entropy coded Markov sources over binary symmetric channels". In *Proceedings of ICC*, page Session 12, Vancouver, Canada, June 1999.

[7] J. Wien and J. D. Villasenor. "Utilizing soft information in decoding of variable length codes". In *Data Compression Conference (DCC)*, Snowbird, Utah, March 1999.

[8] Y. Takishima, M. Wada, and B. Murakami. "Reversible variable length codes". *IEEE Transactions on Communications*, 43:158–162, 1995.

[9] A. Viterbi. "Error bounds for convolutional codes and an asymptotically optimal decoding algorithm". *IEEE Transactions on Information Theory*, 13:260269, 1967.

[10] W. Koch and A. Baier. "Optimum and sub-optimum detection of coded data disturbed by time-varying intersymbol interference". *Proceedings GLOBECOM*, pages 1679–1684, December 1990.

[11] P. Robertson, E. Villebrun, and P. Hoeher. "A comparaison of optimal and sub-optimal map decoding algorithms operating in the log-domain". In *Proceedings of ICC*, pages 1009–1013, Seattle, Wash., June 1995.

[12] J. Hagenauer. "Soft-in/Soft-out: the benefit of using soft values in all stages of digital receiver". Institute for communications technology, 1990.

[13] J. Hagenauer and P. Hoeher. "A Viterbi algorithm with soft-decision outputs and its applications". *Proceedings GLOBECOM*, pages 1680–1686, November 1989.

[14] L. R. Bahl, J. Cocke, F. Jelinek, and J. Raviv. "Optimal decoding of linear codes for minimizing symbol error rate". *IEEE Transactions on Information Theory*, pages 284–287, March 1974.

[15] S. Benedetto and G. Montorsi. "Generalized concatenated codes with interleavers". In *International Symposium on Turbocodes*, pages 32–39, Brest, September 1997.

[16] J. Hagenauer. "Source-controlled channel decoding". *IEEE Transactions on Communications*, 43:2449–2457, September 1995.

[17] A. E. Escott and S. Perkins. "Binary Huffman equivalent codes with a short synchronizing codeword". *IEEE Transactions on Information Theory*, 44:346–351, January 1998.

[18] D. A. Huffman. "Method for the reconstruction of minimum redundancy codes". *Key Papers in The development of Information Theory*, pages 47–50, 1952.

[19] K. Sayood and J. C. Borkenhagen. "Utilization of correlation in low rate dpcm systems for channel error protection". In *Proceedings of ICC*, pages 1388–1892, June 1986.

REFERENCES

[20] R. Bauer and J. Hagenauer. "Iterative source/channel decoding using reversible variable length codes". In *Data Compression Conference (DCC)*, Snowbird, Utah, March 2000.

[21] J. Wien and J. D. Villasenor. "A class of reversible variable length codes for robust image and video coding". In *ICIP*, volume 2, pages 65–68, Santa Barbara, Calif., October 1997.

[22] A. H. Murad and T. E. Fuja. "Robust transmission of variable-length encoded sources". In *IEEE Wireless Communications and Networking Conference*, New Orleans, La., September 1999.

[23] A. H. Murad and T. E. Fuja. "Variable length source codes, channel codes, and list-decoding". In *information Theory Workshop (ITW)*, Kruger national park, South Africa, June 1999;

[24] Video Group. *"Error-resilient video coding in the ISO MPEG4 standard"*. R. Talluri, 1997.

[25] N. Seshadri and C. E. Sundberg. "List Viterbi decoding algorithms with applications". *IEEE transactions on communications*, 42: 313–323, February 1994.

[26] P. Robertson, E. Villebrun, and P. Hoeher. "A comparison of optimal and suboptimal map decoding algorithms operating in the log-domain". In *Proceedings of ICC*, pages 1009–1013, Seattle, Wash., June 1995.

[27] J. C. Carlach, D. Castelain, and P. Combelles. "Soft-decoding of convolutional block codes for an interactive television return channel". In *International Conference on Universal Communications Records*, pages 249–253, San Diego, Calif., October 1997.

[28] C. Berrou, C. Douillard, and M. Jezequel. "Multiple parallel concatenation of circular recursive systematic convolutional (CRSC) codes" In *Annales des telecommunications*, pages 166–172, March 1997.

What is claimed is:

1. A method for the decoding of received digital data, corresponding to sent digital data encoded by an entropic code associating a distinct sequence of bits with each symbol of a group of symbols, the length of the sequence depending on probability of occurrence of a respective symbol, the method being characterized by implementing a decoding lattice for which each transition corresponds to a binary value of one of the bits of a sequence of bits corresponding to one of the symbols.

2. The decoding method according to claim 1, wherein the entropic code is represented in the form of a binary tree comprising a root node, a plurality of intermediate nodes and a plurality of leaf nodes so that a sequence of bits corresponding to one of the symbols is derived from successive transitions of the tree from the root node to the leaf node associated with the symbol, the method being characterized in that each stage of the lattice comprises a single extremal state corresponding to the root node and to all of the leaf nodes, and a distinct intermediate state for each of the intermediate nodes.

3. The decoding method according to claim 1, characterized in that a likelihood information is associated with each transition of the lattice.

4. The decoding method according to claim 3, characterized in that the likelihood information is a metric representing the transmission channel and a priori information on the entropic code.

5. The decoding method according to claim 4, characterized in that the a priori information belongs to a group comprising:

the implemented entropic code, an a priori probability of each of the symbols of the code, a number of symbols sent, and/or borderline values for the coefficients.

6. The decoding method according to claim 4, characterized in that the $$\Gamma[(x_k,x_k^p),d_k,d_{k-1}]=Pr(x_k/a_k=i)Pr(y_k^p/a_k=i,d_k,d_{k-1})Pr\{a_k=i,d_k/d_{k-1}\}$$

is computed for each of the transitions.

7. The decoding method according to claim 1, characterized in that the entropic code belongs to a group comprising Huffman codes and reversible variable length codes (RVLC).

8. The decoding method according to claim 7, characterized in that the entropic code is an RVLC code and the a priori information is used for a forward phase in the path through the lattice and a backward phase in the path through the lattice.

9. The decoding method according to claim 1, characterized in that it further comprises a step of searching for a most probable authorized sequence by reduced symbol lattice having a single initial state from which there are as many outgoing and arriving symbols as there are sequences of bits.

10. A device for the decoding of digital data, implementing the decoding method according to claim 1.

11. A digital signal transmission system characterized in that it implements an entropic source encoding operation and a channel encoding operation at transmission, and a decoding operation at reception according to the method of claim 1.

12. A method for joint source-channel decoding of a received digital signal source encoded by an entropic code associating a distinct sequence of bits with each of a group of symbols, a length of the sequence being a function of a probability of occurrence of the respective symbol, characterized by a source decoding operation using at least one decoding lattice, each transition of which corresponds to a binary value of one of the bits of the bit sequence corresponding to one of the symbols, the source decoding operation delivering information extrinsic to the channel decoding.

13. The joint decoding method according to claim 12, characterized in that the channel decoding implements a turbo-code type of decoding.

14. The joint decoding method according to claim 13, characterized in that the turbo-code type decoding relies on a parallel type of implementation.

15. The joint decoding method according to claim 13, characterized in that the turbo-code type decoding relies on a serial type of implementation.

16. The joint decoding method according to claim 13, characterized in that each iteration of turbo-code type decoding implements a block matrix, having rows and columns, on which a row decoding operation is performed followed by a column decoding operation, or a column decoding operation is performed followed by a row decoding operation, and in that an a priori information is used for the row or column decoding operation respectively.

17. The joint decoding method according to claim 16, characterized in that each row or column, respectively, corresponds to a sequence of k information bits.

18. The joint decoding method according to claim 16, characterized in that it implements a step to detect a beginning and/or end of each sequence of bits.

19. The joint decoding method according to claim 18, characterized in that the detection step relies on an implementation of at least one of the techniques belonging to a group comprising:

the insertion at transmission of a beginning of symbol and/or end-of-information, the insertion of padding bits so that the symbols accompanied by the padding bits have a constant length, the use of a "tail-biting" technique, and the use of a circular lattice.

20. The joint decoding method according to claim 12, characterized in that it relies on an iterative type of implementation.

21. The joint decoding method according to claim 20, characterized in that each of the iterations sequentially comprises a channel decoding step and a source decoding step, the channel decoding step delivering channel information considered in the source decoding step, the source decoding step delivering an a priori information considered in the channel decoding step.

22. The joint decoding method according to claim 20, characterized in that each of the iterations comprises a first channel decoding step employing a first interleaver a first source decoding steps fed by the first channel decoding step, a second channel decoding step fed by the first channel decoding step and the first source decoding step through a second interleaver modeled on the first interleaver and feeding the first channel decoding step through a de-interleaver symmetrical with the first interleaver, and a second source decoding step fed by the second channel decoding step through the de-interleaver and feeding to the first channel decoding step.

23. The joint decoding method according to claim 12, characterized in that the entropic code is a reversible variable length code (RVLC).

24. The joint decoding method according to claim 23, characterized in that channel decoding and source decoding lattices are concatenated, and the channel decoding is controlled by an a priori information on the source.

25. The joint decoding method according to claim 24, characterized in that it implements a parallel or serial type of list Viterbi algorithm associated with a step for replacement, on a path through the channel decoding lattice, of a sequence not authorized by the source with the most probable authorized sequence.

26. The joint decoding method according to claim 24, characterized in that it implements a SUBMAP algorithm in the forward and backward directions through the channel decoding lattice.

27. A method for the joint source-channel decoding of a received digital signal source encoded by an entropic code associating a distinct sequence of bits with each symbol of a group of symbols, the length of the sequence being a function of a probability of occurrences of a respective symbol, characterized by implementing a channel-decoding lattice, such that with each state of each stage there is associated information representing a sequence of previously decoded bits passing through this state, the information being based on a path direction of the lattice and designating a position of the bits considered in the lattice representing the entropic code and/or information to verify a number of decoded symbols and/or a value taken by the decoded bits.

28. The joint decoding method according to claim 27, characterized in that it comprises, for each of the states, steps of:

addition of the channel metric and the source metric to the path direction into the state, comparison of the two new metrics and the selection of the shortest metric, and if the information designating the position indicates the end of a symbol, considering the node to be a leaf of the tree, or if the information does not indicate the end of a symbol, passing on to the next node in the tree.

29. The joint decoding method according to claim 27, characterized in that it implements an iterative procedure.

30. The joint decoding method according to claim 29, characterized in that it comprises steps of:

a first channel decoding operation, employing a first interleaver and implementing a channel decoding lattice for which each state has information designating the position of the bits considered in a tree representing the entropic code, a second channel decoding operation fed by the first channel decoding step through a second interleaver modeled on the first interleaver and feeding the first channel decoding step through a de-interleaver symmetrical with the first interleaver, a source decoding operation fed by the second channel decoding step through the de-interleaver.

31. The joint decoding method according to claim 30, characterized in that it implements a turbo-code type decoding.

* * * * *

UNITED STATES PATENT AND TRADEMARK OFFICE
CERTIFICATE OF CORRECTION

| | | |
|---|---|---|
| PATENT NO. | : 6,812,873 B1 | Page 1 of 1 |
| APPLICATION NO. | : 10/111833 | |
| DATED | : November 2, 2004 | |
| INVENTOR(S) | : Pierre Siohan et al. | |

It is certified that error appears in the above-identified patent and that said Letters Patent is hereby corrected as shown below:

On the title page item (73) Assignee:

Please delete "France Telecom, Paris (FR)" and insert -- France Telecom, Paris, (FR); Telediffusion De France, Paris Cedex (FR) --

Signed and Sealed this
Twentieth Day of October, 2015

Michelle K. Lee
*Director of the United States Patent and Trademark Office*